United States Patent
Balseanu et al.

(10) Patent No.: US 11,133,178 B2
(45) Date of Patent: Sep. 28, 2021

(54) SEAMLESS GAPFILL WITH DIELECTRIC ALD FILMS

(71) Applicant: Applied Materials, Inc., Santa Clara, CA (US)

(72) Inventors: Mihaela Balseanu, Sunnyvale, CA (US); Ning Li, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 250 days.

(21) Appl. No.: 16/577,459

(22) Filed: Sep. 20, 2019

(65) Prior Publication Data

US 2021/0090882 A1   Mar. 25, 2021

(51) Int. Cl.
*H01L 21/31* (2006.01)
*H01L 21/02* (2006.01)

(52) U.S. Cl.
CPC .... *H01L 21/02164* (2013.01); *H01L 21/0217* (2013.01); *H01L 21/0228* (2013.01); *H01L 21/02274* (2013.01)

(58) Field of Classification Search
CPC .......... H01L 21/02164; H01L 21/0217; H01L 21/02274; H01L 21/0228; H01L 21/76232; H01L 21/76224; H01L 27/0207; H01L 27/11519; H01L 27/11524
USPC ................. 438/257–264, 787; 257/314–321
See application file for complete search history.

(56) References Cited

U.S. PATENT DOCUMENTS

| | | |
|---|---|---|
| 5,726,094 A | 3/1998 | Schwalke et al. |
| 5,805,973 A | 9/1998 | Coffinberry et al. |
| 6,077,643 A | 6/2000 | Kumar et al. |
| 6,149,974 A | 11/2000 | Nguyen et al. |
| 6,149,987 A | 11/2000 | Perng et al. |
| 6,200,893 B1 | 3/2001 | Sneh |
| 6,319,324 B1 | 11/2001 | Nguyen et al. |
| 6,352,755 B1 | 3/2002 | Finley et al. |
| 6,492,694 B2 | 12/2002 | Noble et al. |
| 6,642,092 B1 | 11/2003 | Voutsas et al. |
| 6,730,584 B2 | 5/2004 | Schuegraf et al. |
| 6,759,081 B2 | 7/2004 | Huganen et al. |
| 6,849,471 B2 | 2/2005 | Patel et al. |
| 6,867,152 B1 | 3/2005 | Hausmann et al. |
| 7,208,354 B2 | 4/2007 | Bauer |
| 7,335,609 B2 | 2/2008 | Ingle et al. |
| 7,541,297 B2 | 6/2009 | Mallick et al. |
| 7,544,576 B2 | 6/2009 | Jawarani et al. |
| 7,625,820 B1 | 12/2009 | Papasouliotis et al. |
| 7,630,114 B2 | 12/2009 | Wang et al. |
| 7,776,707 B2 | 8/2010 | Yoshida et al. |
| 7,910,491 B2 | 3/2011 | Kwon et al. |

(Continued)

FOREIGN PATENT DOCUMENTS

WO    2009/082517 A1    7/2009

OTHER PUBLICATIONS

PCT International Search Report and Written Opinion in PCT/US2020/051502 dated Jan. 7, 2021, 10 pages.

(Continued)

*Primary Examiner* — Brook Kebede
(74) *Attorney, Agent, or Firm* — Servilla Whitney LLC

(57) ABSTRACT

Methods for filling a substrate feature with a seamless dielectric gap fill are described. Methods comprise sequentially depositing a film with a seam, etching the the film to form a recess, and depositing a second film in the recess to form a seamless gap fill.

20 Claims, 8 Drawing Sheets

(56) References Cited

U.S. PATENT DOCUMENTS

| | | | |
|---|---|---|---|
| 8,129,290 B2 | 3/2012 | Balseanu et al. | |
| 8,338,225 B2 | 12/2012 | Breitwisch et al. | |
| 8,557,712 B1 | 10/2013 | Antonelli et al. | |
| 8,575,753 B2 | 11/2013 | Choi et al. | |
| 8,697,533 B2 | 4/2014 | Herner | |
| 8,728,955 B2 | 5/2014 | Lavoie et al. | |
| 8,728,958 B2 | 5/2014 | Ashtiani et al. | |
| 8,753,989 B2 | 6/2014 | Balseanu et al. | |
| 8,883,603 B1 | 11/2014 | Maxwell | |
| 9,087,878 B2 | 7/2015 | Yu et al. | |
| 9,355,886 B2 | 5/2016 | Swaminathan et al. | |
| 9,502,648 B2 | 11/2016 | Yoon | |
| 9,543,319 B1* | 1/2017 | Wu | H01L 27/1157 |
| 10,192,775 B2 | 1/2019 | Manna et al. | |
| 2002/0086110 A1 | 7/2002 | Vercammen et al. | |
| 2003/0083189 A1 | 5/2003 | Yamamoto et al. | |
| 2003/0155074 A1 | 8/2003 | Yao | |
| 2003/0224598 A1* | 12/2003 | Lee | H01L 21/76877 |
| | | | 438/666 |
| 2005/0208760 A1 | 9/2005 | Ryan | |
| 2006/0199399 A1 | 9/2006 | Muscat | |
| 2006/0202311 A1 | 9/2006 | Nguyen et al. | |
| 2007/0037360 A1 | 2/2007 | Jeong | |
| 2007/0117359 A1 | 5/2007 | Todd | |
| 2008/0124925 A1 | 5/2008 | Madan et al. | |
| 2008/0138985 A1 | 6/2008 | Madan et al. | |
| 2008/0217775 A1* | 9/2008 | Pai | H01L 21/76877 |
| | | | 257/751 |
| 2008/0254619 A1 | 10/2008 | Lin et al. | |
| 2008/0311711 A1 | 12/2008 | Hampp et al. | |
| 2009/0035941 A1 | 2/2009 | Park et al. | |
| 2009/0075454 A1 | 3/2009 | Ang | |
| 2009/0079013 A1 | 3/2009 | Kim | |
| 2009/0098706 A1 | 4/2009 | Kim et al. | |
| 2009/0179310 A1 | 7/2009 | Dunton et al. | |
| 2009/0246974 A1 | 10/2009 | Clark | |
| 2011/0034039 A1 | 2/2011 | Liang et al. | |
| 2011/0097902 A1 | 4/2011 | Singh et al. | |
| 2011/0159213 A1 | 6/2011 | Cai et al. | |
| 2011/0198736 A1 | 8/2011 | Shero et al. | |
| 2012/0009802 A1 | 1/2012 | Lavoie et al. | |
| 2012/0012170 A1 | 1/2012 | Foss et al. | |
| 2012/0196451 A1 | 8/2012 | Mallick | |
| 2012/0213940 A1 | 8/2012 | Mallick | |
| 2012/0244701 A1 | 9/2012 | Higuchi et al. | |
| 2013/0084700 A1 | 4/2013 | Swerts et al. | |
| 2013/0171822 A1 | 7/2013 | Chandrashekar et al. | |
| 2013/0196078 A1 | 8/2013 | Yudovsky et al. | |
| 2014/0011354 A1 | 1/2014 | Lei et al. | |
| 2014/0045342 A1 | 2/2014 | Mallick et al. | |
| 2014/0068962 A1 | 3/2014 | Mori et al. | |
| 2014/0159145 A1 | 6/2014 | Park | |
| 2014/0252620 A1 | 9/2014 | Huang et al. | |
| 2014/0273529 A1 | 9/2014 | Nguyen et al. | |
| 2014/0349478 A1 | 11/2014 | Koschinsky et al. | |
| 2015/0017794 A1 | 1/2015 | Takamure et al. | |
| 2015/0044442 A1 | 2/2015 | Huang et al. | |
| 2015/0147824 A1 | 5/2015 | Cameron et al. | |
| 2015/0162214 A1 | 6/2015 | Thompson et al. | |
| 2015/0170961 A1 | 6/2015 | Romero et al. | |
| 2015/0243545 A1 | 8/2015 | Tang et al. | |
| 2015/0299848 A1 | 10/2015 | Haukka et al. | |
| 2016/0056077 A1 | 2/2016 | Lai et al. | |
| 2016/0093528 A1 | 3/2016 | Chandrashekar et al. | |
| 2016/0148800 A1 | 5/2016 | Henri et al. | |
| 2016/0222504 A1 | 8/2016 | Haukka et al. | |
| 2017/0278749 A1 | 9/2017 | Chandrashekar et al. | |

OTHER PUBLICATIONS

Bitto, Florian , et al., "Chlorosilanes and 3,5-Dimethylpyrazole: Multinuclear Complexes, Acetonitrile Insertion and 29Si NMR Chemical-Shift Anisotropy Studies", Eur. J. Inorg. Chem. 2013, 2954-2962.

Hashemi, Fatemeh Sadat Minaye, et al., "Self-Correcting Process for High Quality Patterning by Atomic Layer Deposition", American Chemical Society, 2015, vol. 9, No. 9, pp. 8710-8717.

Hashemi, Fatemeh Sadat Minaye, et al., "Sequential Regeneration of Self-Assembled Monolayers for Highly Selective Atomic Layer Deposition", Advanced Materials Interfaces, 2016, 7 pages.

Kalanyan, Berc , et al., "Using Hydrogen to Expand the Inherent Substrate Selectivity Window During Tungsten Atomic Layer Deposition", American Chemical Society, Chern. Mater. 2016, 28, pp. 117-126.

Kim, Honggun , et al., "Novel Flowable CVD Process Technology for sub-20nm Interlayer Dielectrics", Process Development Team, Semiconductor R&D Center, Thin Film Team, Manufacturing Center, Samsung Electronics Co., LTD., 2012, 3 pages.

Lee, Younghee , et al., "Atomic Layer Deposition of AlF3 Using Trimethylaluminum and Hydrogen Fluoride", The Journal of Physical Chemistry C., 2015, 119 (25), p. 14185-14194.

Mahé, Olivier , et al., "Deoxofluorination Reactions Using N,N-Disubstituted Aminodifluorosulfinium Tetrafluoroborate Salts", Journal of Fluorine Chemistry 153 (2013) 57-60.

Selvaraj, Sathees Kannan, et al., "Selective atomic layer deposition of zirconia on copper patterned silicon substrates using ethanol as oxygen source as well as copper reductant", Journal of Vacuum Science & Technology A, 32(1), Jan./Feb. 2014, 5 pages.

Smith, Catherine J., et al., "Palladium catalysed aryl amination reactions in supercritical carbon dioxide", Org. Biomol. Chem., 2005, 3, 3767-3781.

Tao, Qian , et al., "On the initial growth of atomic layer deposited TiO2 films on silicon and copper surfaces", Thin Solid Films 520 (2012), pp. 6752-6756.

Tao, Qian , et al., "Selective Atomic Layer Deposition of HfO 2 on Copper Patterned Silicon Substrates", Applied Physics Letters 96, 192105 (2010), 4 pages.

Tarre, Aivar , et al., "Atomic layer deposition of Cr2O3 thin films: Effect of crystallization on growth and properties", Applied Surface Science 254 (2008), pp. 5149-5156.

Wang, Guilei , et al., "Application of Atomic Layer Deposition Tungsten (ALD W) as Gate Filling Metal for 22 nm and Beyond Nodes CMOS Technology", ECS Journal of Solid State Science and Technology, 3 (4) p. 82-p. 85 (2014).

Yan, Yan , et al., "Flowable CVD Process Application for Gap Fill at Advanced Technology", ECS Transactions, 60 (1) 503-506 (2014).

* cited by examiner

SEAMLESS GAPFILL WITH DIELECTRIC ALD FILMS

TECHNICAL FIELD

Embodiments of the disclosure generally relate to methods for filling substrate features. More particularly, embodiments of the disclosure are directed to methods for filling a substrate feature with a seamless conformal and/or selective (dry/wet) etch method.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase post curing methods of the as deposited flowable films become difficult. Resulting in films with varying composition throughout the filled trench.

Amorphous silicon has been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, filling high aspect ratio gaps becomes increasingly sensitive for advanced wafer fabrication. Current metal replacement gate processes involve a furnace poly-silicon or amorphous silicon dummy gate. A seam forms in the middle of the Si dummy gate due to the nature of process. This seam may be opened up during the post process and cause structure failure.

Conventional plasma-enhanced chemical vapor deposition (PECVD) of amorphous silicon (a-Si) forms a "mushroom shape" film on top of the narrow trenches. This is due to the inability of the plasma to penetrate into the deep trenches. The results in pinching-off the narrow trench from the top; forming a void at the bottom of the trench. Conventional thermal CVD/furnace processes can grow a-Si via thermal decomposition of a silicon precursor (e.g., silane). Due to the inadequate precursor supply or presence of decomposition byproduct, however, the deposition rate is higher on top of trenches comparing with it at the bottom. A narrow seam or void can be observed in the trench.

Flowable films, e.g. flowable CVD films provide a particular solution to resolve the issue of void or seam containing gap fill at contact levels, but flowable films suffer from poor film quality, or require additional treatment steps to improve film quality. Therefore, there is a need for an improved method to create a seamless gap fill.

SUMMARY

One or more embodiments of the disclosure are directed to a processing method. The processing method comprises depositing a first film on a substrate surface, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the first film having a void located within the width of the feature at a first distance from the bottom surface of the feature, and the first film having a first seam with a first seam length; and performing a process cycle comprising etching the first film to form a first recess having a first recess depth less than the first distance, depositing a second film in the first recess and on the substrate surface, etching the second film to form a second recess having a second recess depth less than the first depth, and depositing a third film in the second recess and on the substrate surface.

Another embodiment of the disclosure is directed to a processing method. The processing method comprising: forming a film stack on a substrate, the film stack comprising a plurality of alternating layers of an oxide material and a nitride material and the film stack having a stack thickness; etching the film stack to form an opening extending a depth from a top of the film stack surface to a bottom surface, the opening having a width defined by a first sidewall and a second sidewall; depositing a first film on the film stack surface, and on the first sidewall, the second sidewall, and the bottom surface of the opening, the first film having a void located within the width of the opening at a first distance from the bottom surface of the opening, and the first film having a first seam with a first seam length; etching the first film to form a first recess having a first recess depth; depositing a second film in the first recess and on the substrate surface; etching the second film to form a second recess having a second recess depth less than the first recess depth; and depositing a third film in the second recess and on the substrate surface.

Other embodiments of the disclosure are directed to a processing method. The processing method comprising: providing a substrate surface with at least one feature thereon, the at least one feature extending a feature depth from the substrate surface to a bottom surface, the at least one feature having a width defined by a first sidewall and a second sidewall; depositing a first film on the substrate surface, and the first sidewall, the second sidewall, and the bottom surface of the at least one feature, the first film having a void located within the width of the feature at a first distance from the bottom surface of the feature, and the first film having a first seam with a first seam length; etching the first film to form a first recess having a first recess depth; depositing a second film in the first recess and on the substrate surface; etching the second film to form a second recess having a second recess depth less than the first recess depth; and depositing a third film in the second recess and on the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

Embodiments of the disclosure provide methods of depositing a film (e.g., silicon nitride (SiN) or silicon oxide ($SiO_x$)) in high aspect ratio (AR) structures with small dimensions. Some embodiments advantageously provide methods involving cyclic deposition-etch-treatment processes that can be performed in a cluster tool environment. Some embodiments advantageously provide seam-free high quality films to fill up high AR trenches with small dimensions.

Figure 1:
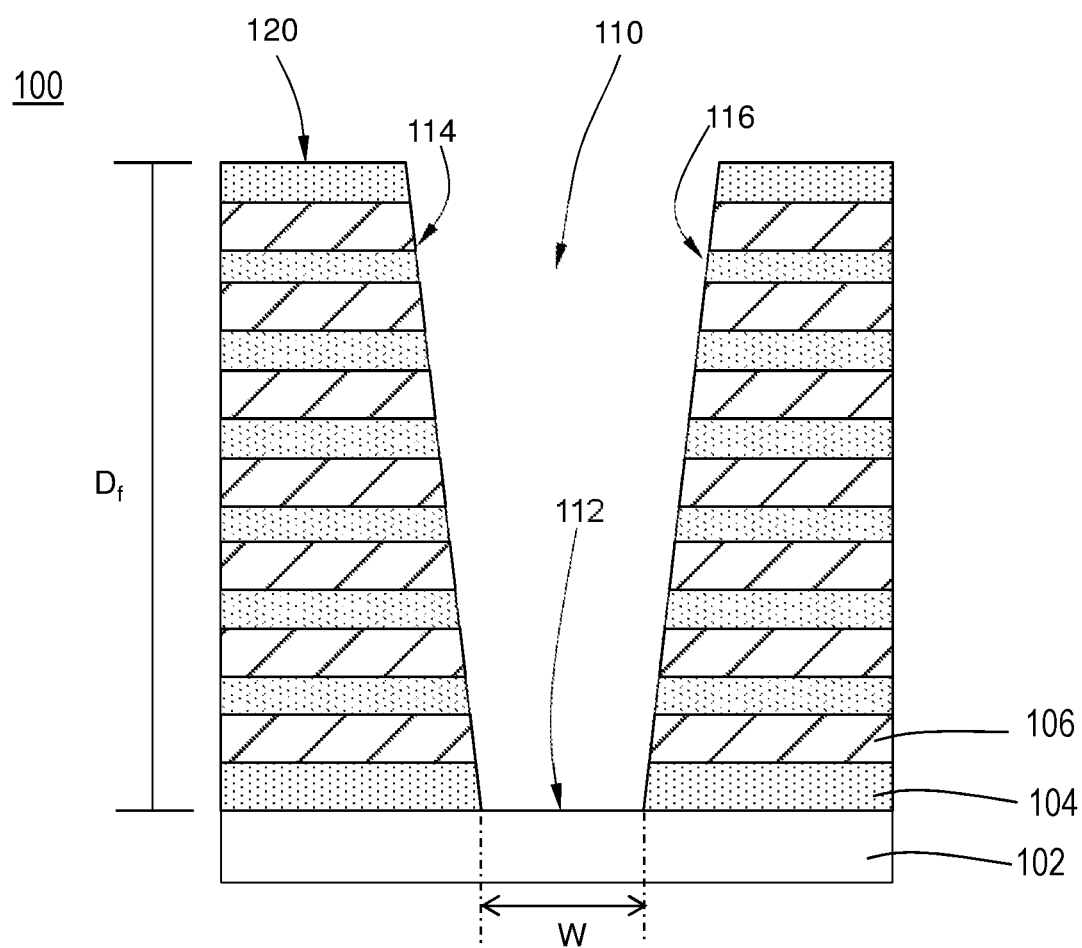
FIG. 1 shows a cross-sectional view of a substrate feature in accordance with one or more embodiment of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The at least one feature 110 extends from the substrate surface 120 to a feature depth $D_f$ to a bottom surface 112. The at least one feature 110 has a first sidewall 114 and a second sidewall 116 that define a width W of the at least one feature 110. The open area formed by the sidewalls 114, 116 and bottom 112 are also referred to as a gap. In one or more embodiments, the width W is homogenous along the depth D1 of the at least one feature 110. In other embodiments, the width, W, is greater at the top of the at least one feature 110 than the width, W, at the bottom surface 112 of the at least one feature 110.

In one or more embodiments, the substrate 100 is a film stack comprising a plurality of alternating layers of a nitride material 104 and an oxide material 106 deposited on a semiconductor substrate 102.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the at least one feature 110 comprises a memory hole or a word line slit. Accordingly, in one or more embodiments, the substrate 100 comprises a memory device or a logic device, e.g. NAND, VNAND, DRAM, or the like.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

Figure 2A:
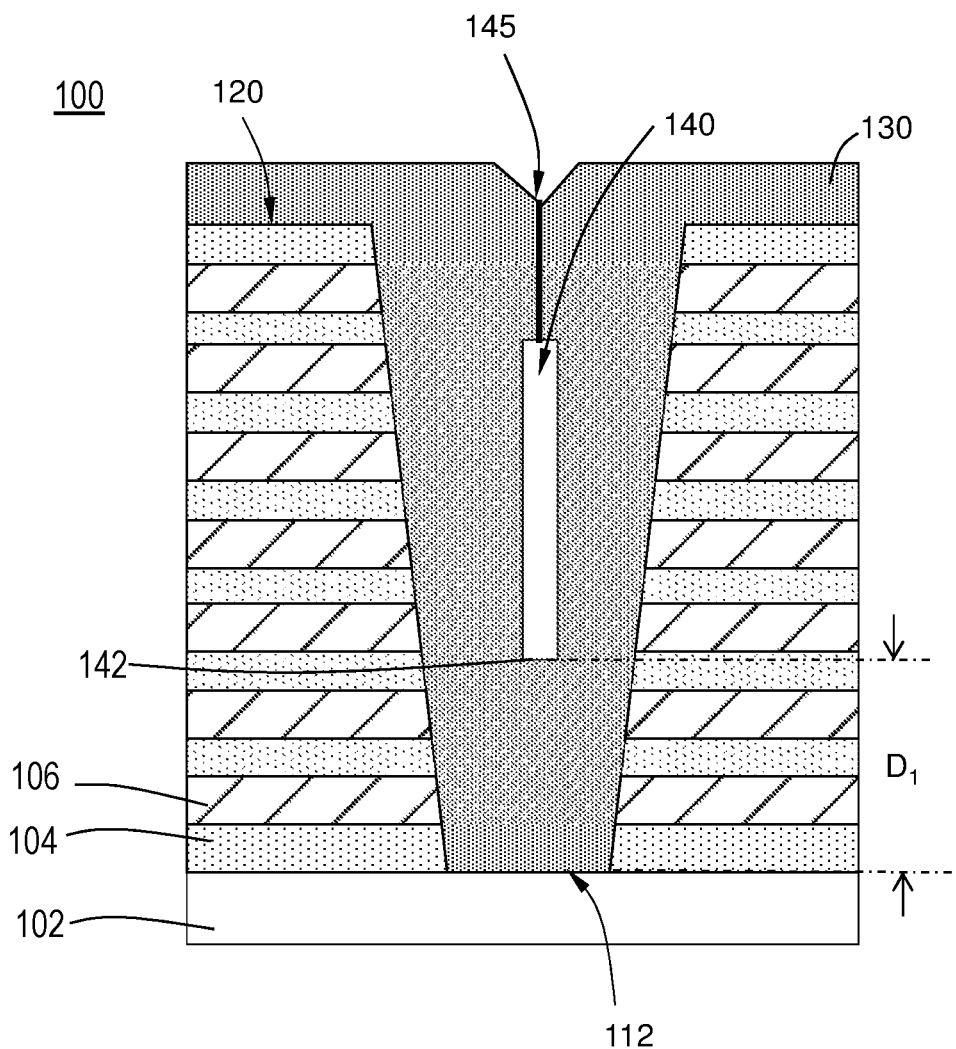
FIGS. 2A through 2E show a cross-sectional schematic of a gapfill process in accordance with one or more embodiment of the disclosure.
Figure 2B:
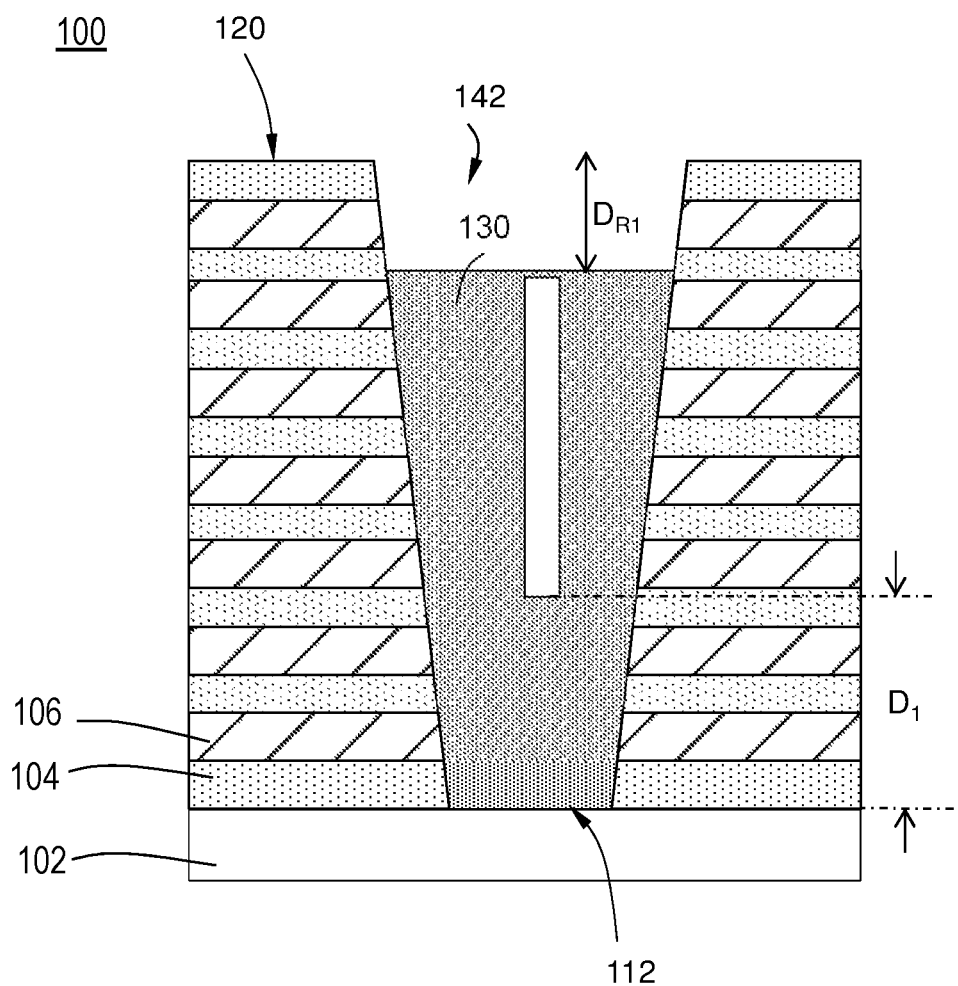

FIGS. 2A through 2E show a cross-sectional schematic of a gapfill process in accordance with one or more embodiment of the disclosure. FIG. 3 shows a processing method 200 in accordance with one or more embodiments of the disclosure. With reference to FIGS. 2A through 2E and FIG. 3, in one or more embodiments, at least one feature 110 is formed on a substrate 100. In some embodiments, the substrate 100 is provided for processing prior to operation 202. As used in this regard, the term "provided" means that the substrate is placed into a position or environment for further processing. In one or more embodiments, the substrate 100 has at least one feature 110 already formed thereon. In other embodiments, at operation 202, at least one feature 110 is formed on a substrate 100. In one or more embodiments, the at least one feature extends a feature depth, $D_f$, from the substrate surface to a bottom surface, the at least one feature having a width, W, defined by a first sidewall 114 and a second sidewall 116.

In one or more embodiments, at operation 204, a first film 130 is formed on the substrate surface 120 and the walls 114, 116 and the bottom of the at least one feature 110. As illustrated in FIG. 2A, in one or more embodiments, the first film has a void 140 located within the width, W, of the at least one feature 110 at a first distance, $D_1$, from the bottom surface of the at least one feature 110.

In one or more embodiments, the first film 130 can be comprised of any suitable material. In some embodiments, the first film 130 comprises one or more of silicon nitride (SiN) or silicon oxide ($SiO_x$). In one or more embodiments, the first film is formed by atomic layer deposition or plasma-enhanced atomic layer deposition.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. manganese precursor, ruthenium precursor, or a manganese-ruthenium precursor) is pulsed into the reaction zone followed by a first time delay. Next, a second precursor or compound B (e.g. reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The precursor-containing process gas may be provided in one or more pulses or continuously. The flow rate of the precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The precursor can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the substrate is exposed to the one or more precursor-containing process gas may be any suitable amount of time necessary to allow the precursor to form an adequate nucleation layer atop the conductive surface of the bottom of the opening. For example, the process gas may be flowed into the process chamber for a period of about 0.1 seconds to about 90 seconds. In some time-domain ALD processes, the precursor-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the precursor-containing process gas. The carrier gas may be mixed with the precursor-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more embodiments, a precursor-containing process gas is mixed with argon prior to flowing into the process chamber.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Suitable silicon precursors include, but are not limited to, silane, disilane, dichlorosilane (DCS), trisilane, tetrasilane, etc. In one or more embodiments, the precursor may be heated in a hot can to increase the vapor pressure and be delivered to the chamber using a carrier gas (e.g., ultrahigh purity (UHP) Ar, He, $H_2$, etc.).

In some embodiments, the first film 130 forms conformally on the at least one feature 110. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the first film 130 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

With reference to FIG. 2A, in one or more embodiments, a void 140 is formed within the width, W, of the at least one feature 110. In one or more embodiments, when the first film 130 is deposited, a first seam 145 is formed in first film 130. In one or more embodiments, the first seam 145 has a first seam length. The void is illustrated as a rectangular opening in the first film 130. Those skilled in the art, however, will understand that this is merely for illustrative purposes. The shape and size of the void 140 can vary. In one or more embodiments, the void 140 has a bottom edge 142 that is a first distance $D_1$ from the bottom surface 112 of the at least one feature 110.

In one or more embodiments, when first seam 145 is formed, decision 205a directs the process to the next phase. Referring to FIG. 2B and FIG. 3, at operation 206, the first film 130 is etched to form a first recess 142 having a first recess depth, $D_{R1}$, less than the first distance, $D_1$. In one or more embodiments, the first recess depth, $D_{R1}$, is greater than the first seam length. This is shown in FIG. 2B where the first film 130 is removed from the substrate surface 120 and a portion of the first sidewall 114 and a portion of the second sidewall 116, leaving the film 130 at the bottom surface 112 of the feature 110. In one or more embodiments, the void 140 remains and is closed, and the first seam 145 is removed by the recessing. In other embodiments (not illustrated), a portion of the first seam 145 remains.

The first film 130 may be etched by any process known to one of skill in the art, including, but not limited to, wet etching, plasma-based sputter etching, chemical etching, Siconi® etching, reactive ion etching (RIE), high density plasma (HDP) etching, and the like. In some embodiments, etching the first film 130 comprises exposing the first film 130 to an etch chemistry comprising one or more of $NF_3$, $Cl_2$, HBr, $C_4F_6$, $C_2F_4$, $H_2$, Ar, He or $N_2$. In one or more embodiments, the first film 130 is etched by Siconi® etching.

Figure 2C:
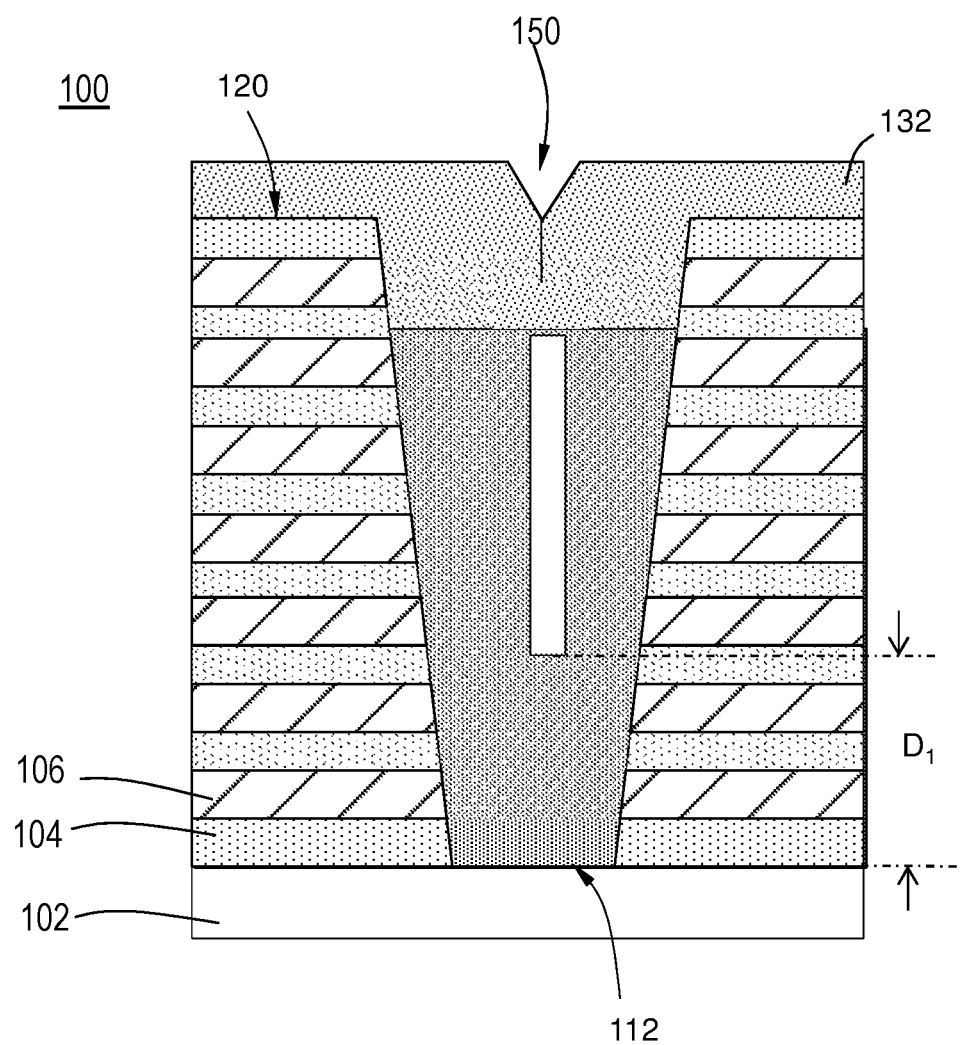
Figure 3:
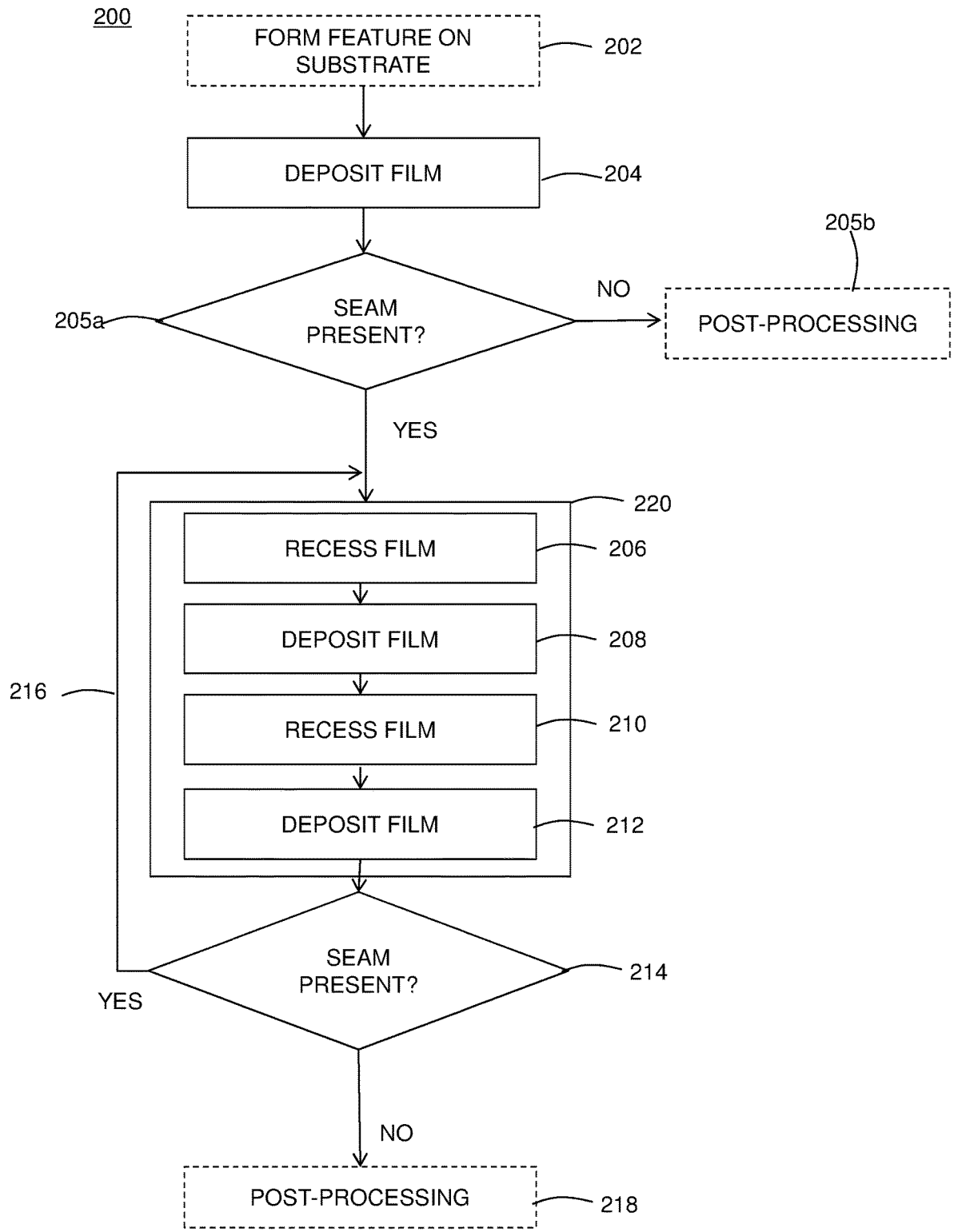
FIG. 3 shows a process flow in accordance with one or more embodiment of the disclosure.

Referring to FIG. 2C and FIG. 3, in one or more embodiments, at operation 208, a second film 132 is deposited in the first recess 142 and on the substrate surface 120.

In one or more embodiments, the second film 132 can be comprised of any suitable material. In some embodiments, the second film 132 comprises one or more of silicon nitride (SiN) or silicon oxide ($SiO_x$). In one or more embodiments, the second film 132 is formed by atomic layer deposition or plasma-enhanced atomic layer deposition. In one or more embodiments, the first film 130 and the second film 132 comprise the same material. In other embodiments, the first film 130 and the second film 132 comprise different materials.

In one or more embodiments, a second seam 150 forms in the second film 132. In one or more embodiments, the second seam 150 has a second seam length. In one or more embodiments, the length of the second seam 150 may be the same as or different from the first seam 145 formed in the deposition of the first film 130.

Figure 2D:
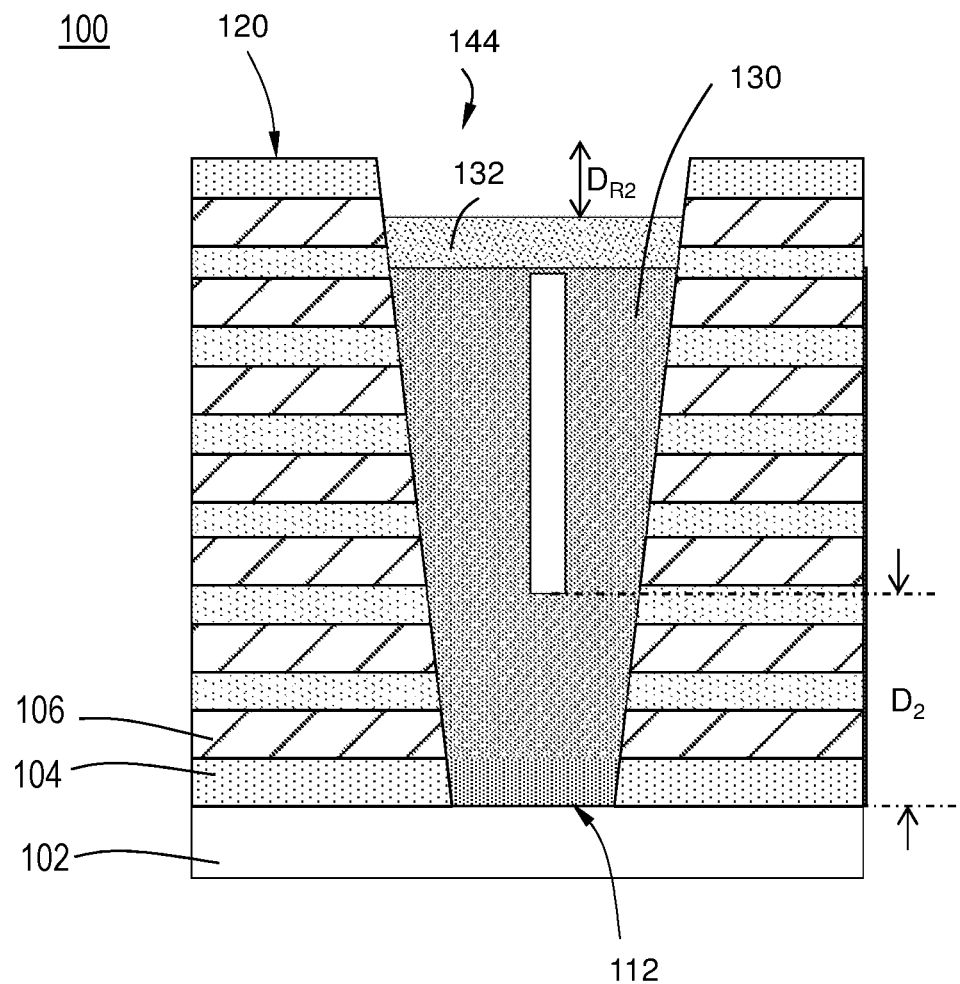

Referring to FIG. 2D and FIG. 3, at operation 210, the second film 132 is etched to form a second recess 144 having a second recess depth, $D_{R2}$. In one or more embodiments, the second recess depth, $D_{R2}$, is less than the first recess depth, $D_{R1}$. In one or more embodiments, the second recess depth, $D_{R2}$, is greater than the second seam length. This is shown in FIG. 2D where the second film 132 is removed from the substrate surface 120 and a portion of the first sidewall 114 and a portion of the second sidewall 116, leaving the first film 130 at the bottom surface 112 of the feature 110, with the second film 132 on a top surface of the first film 130. As illustrated in FIG. 2D, in one or more embodiments, the second seam 150 is removed during the etching process to form the second recess 144. In other embodiments (not illustrated), a portion of the second seam 150 remains.

The second film 132 may be etched by any process known to one of skill in the art, including, but not limited to, wet etching, plasma-based sputter etching, chemical etching, Siconi® etching, reactive ion etching (RIE), high density plasma (HDP) etching, and the like. In some embodiments, etching the second film comprises exposing the second film to an etch chemistry comprising one or more of $NF_3$, $Cl_2$, HBr, $C_4F_6$, $C_2F_4$, $H_2$, Ar, He or $N_2$. In one or more embodiments, the second film 132 is etched by Siconi® etching.

Figure 2E:
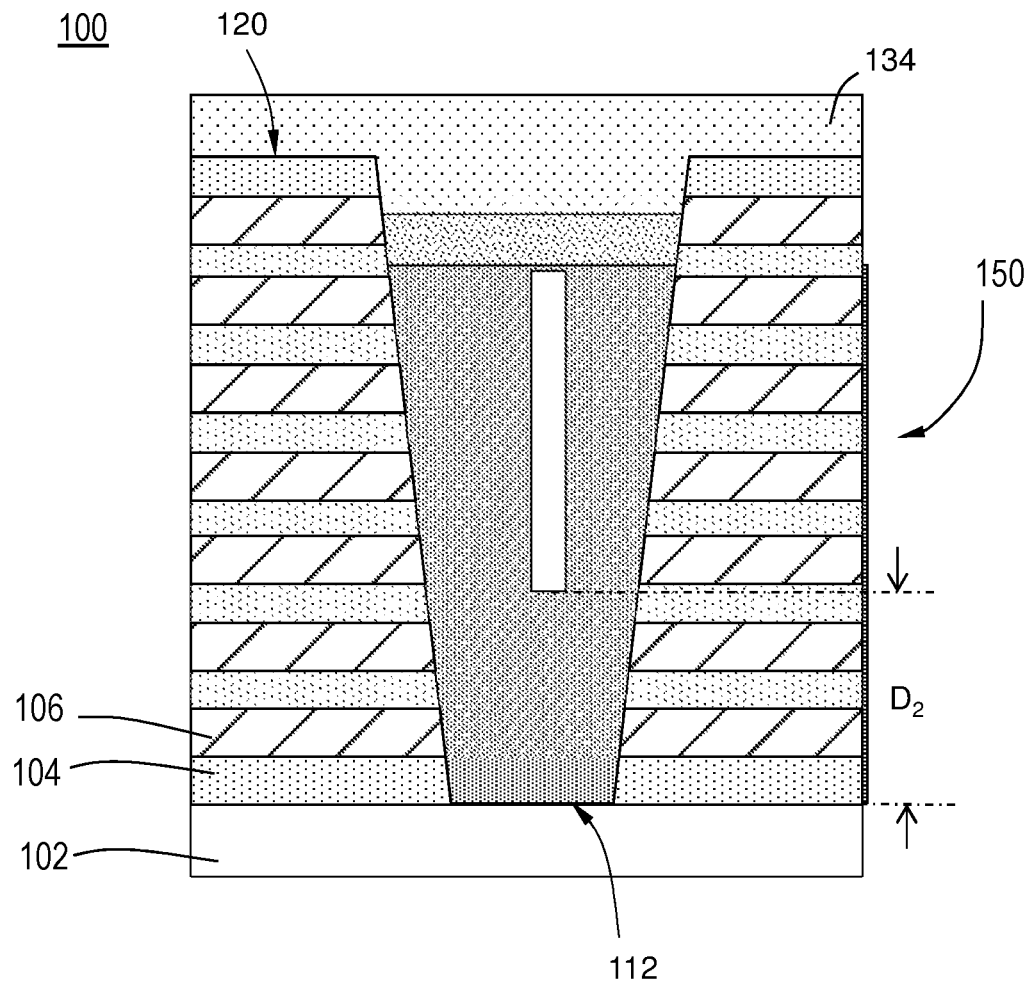

Referring to FIG. 2E and FIG. 3, in one or more embodiments, at operation 212, a third film 134 is deposited in the second recess 144 and on the substrate surface 120.

In one or more embodiments, the third film 134 can be comprised of any suitable material. In some embodiments, the third film 134 comprises one or more of silicon nitride (SiN) or silicon oxide ($SiO_x$). In one or more embodiments, the third film 134 is formed by atomic layer deposition or plasma-enhanced atomic layer deposition. In one or more embodiments, the first film 130, the second film 132, and the third film 134 comprise the same material. In other embodiments, the first film 130, the second film 132, and third film 134 comprise different materials.

Referring to FIG. 3, after the completion of process cycle 220, decision 214 is reached. In one or more embodiments, a seam is present, so the process proceeds at operation 216, where process cycle 220 is repeated until a seam is no longer present.

After a suitable number of sequences or cycles of deposition and reduction, the film 134 formed will have substantially no seam to completely fill the gap of the feature 110. This is shown in FIG. 2E. As used in this specification and the appended claims, the term "substantially no seam", and the like, means that the second seam 150 takes up less than about 1% of the volume of the feature 110. Since, referring to FIG. 2E, substantially no seam 150 is present, decision 214 would direct the process out of the deposition/reduction loop to one or more optional post-processing treatments 218.

According to one or more embodiments, the substrate is subjected to processing prior to and/or after forming the layer. This processing can be performed in the same chamber or in one or more separate processing chambers.

Some embodiments of the disclosure are directed to film deposition processes using a batch processing chamber, also referred to as a spatial processing chamber. In one or more embodiments, the batch processing chamber may be any batch processing chamber known to one of skill in the art. In one or more embodiments, the batch processing chamber is the Olympia® spatial processing chamber available from Applied Materials, Inc. of Santa Clara, Calif.

Figure 4:
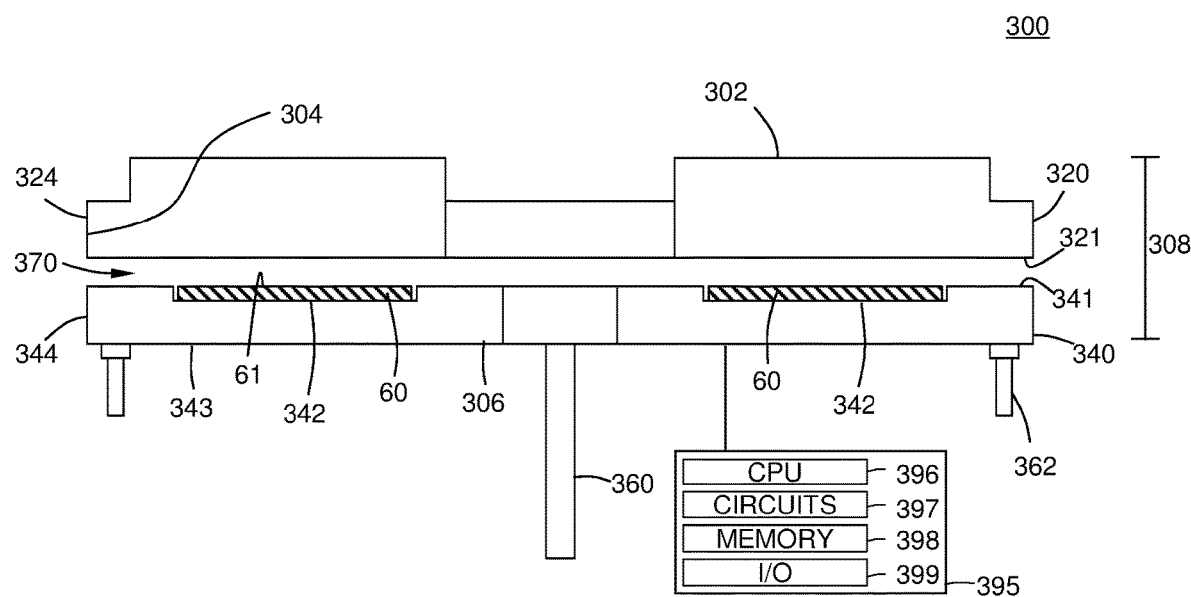
FIG. 4 shows a cross-sectional view of a batch processing chamber in accordance with one or more embodiment of the disclosure.

In one or more embodiments, the recessing/etching occurs in the same processing tool. In one or more embodiments, the process zones in batch processing chamber are plasma etch capable. Referring to FIG. 4, in one or more embodiments, the spatial processing chamber 300 has a chamber top 302, a chamber sidewall 304, and a chamber bottom 306 which together form a chamber body 308 defining a processing volume.

The processing chamber 300 includes a gas distribution assembly 320, also referred to as injectors or an injector assembly, and a susceptor assembly 340. The gas distribution assembly 320 is any type of gas delivery device used in a processing chamber. The gas distribution assembly 320 includes a front surface 321 which faces the susceptor assembly 340. The front surface 321 can have any number or variety of openings to deliver a flow of gases toward the susceptor assembly 340. The gas distribution assembly 320 also includes an outer edge 324 which, in the embodiments shown, is substantially round.

The specific type of gas distribution assembly 320 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

In some embodiments, the gas distribution assembly 320 is a rigid stationary body made of a single injector unit. In one or more embodiments, the gas distribution assembly 320 is made up of a plurality of individual sectors (e.g., injector units, not illustrated). Either a single piece body or a multi-sector body can be used with the various embodiments of the disclosure described.

A susceptor assembly 340 is positioned beneath the gas distribution assembly 320 within the chamber body 308 of the processing chamber 300. The susceptor assembly 340 includes a top surface 341 and at least one recess 342 in the top surface 341. The susceptor assembly 340 also has a bottom surface 343 and an edge 344. The recess 342 can be any suitable shape and size depending on the shape and size of the substrates 60 being processed. In the embodiment shown in FIG. 4, the recess 342 has a flat bottom to support the bottom of the wafer; however, the bottom of the recess can vary. In some embodiments, the recess 342 has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 4A, the recess 342 in the top surface 341 of the susceptor assembly 340 is sized so that a substrate 60 supported in the recess 342 has a top surface 61 substantially coplanar with the top surface 341 of the susceptor 340. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 340 of FIG. 4 includes a support post 360 which is capable of lifting, lowering, and rotating the susceptor assembly 340 around an axis. The susceptor assembly may include a heater, or gas lines, or electrical components within the center of the support post 360. The support post 360 may be the primary means of increasing or decreasing the gap 370 between the susceptor assembly 140 and the gas distribution assembly 320, moving the susceptor assembly 340 into proper position. The susceptor assembly 340 may also include fine tuning actuators 362 which can make micro-adjustments to susceptor assembly 340 to create a predetermined gap 370 between the susceptor assembly 340 and the gas distribution assembly 320.

In some embodiments, the gap 370 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 300 shown in FIG. 4 is a carousel-type chamber in which the susceptor assembly 140 can hold a plurality of substrates 60.

In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    depositing a first film on a substrate surface, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the first film having a void located within the width of the feature at a first distance from the bottom surface of the feature, and the first film having a first seam with a first seam length; and
    performing a process cycle comprising etching the first film to form a first recess having a first recess depth, depositing a second film in the first recess and on the substrate surface, etching the second film to form a second recess having a second recess depth less than the first depth, and depositing a third film in the second recess and on the substrate surface.

2. The method of claim 1, wherein etching the first film does not open the void.

3. The method of claim 1, wherein the first recess depth is greater than the first seam length.

4. The method of claim 1, wherein the first film, the second film, and the third film are independently selected from one or more of silicon nitride (SiN) or silicon oxide ($SiO_x$).

5. The method of claim 4, wherein the first film, the second film, and the third film comprise silicon nitride (SiN).

6. The method of claim 4, wherein the first film, the second film, and the third film comprise silicon oxide ($SiO_x$).

7. The method of claim 1, wherein forming the first film, forming the second film, and forming the third film comprises an atomic layer deposition process.

8. The method of claim 1, further comprising repeating the process cycle n number of time.

9. The method of claim 8, wherein the n number is less than or equal to about 40 cycles.

10. The method of claim 1, wherein the feature has an aspect ratio greater than or equal to about 10:1.

11. The method of claim 1, wherein the depth of the at least one feature is in a range of about 50 nm to about 100 nm.

12. The method of claim 1, wherein the substrate comprises a stack of a plurality of alternating layers of an oxide material and a nitride material.

13. The method of claim 1, wherein the at least one feature comprises a memory hole or a word-line slit.

14. A processing method comprising:
    forming a film stack on a substrate, the film stack comprising a plurality of alternating layers of an oxide material and a nitride material and the film stack having a stack thickness;
    etching the film stack to form an opening extending a depth from a top of the film stack surface to a bottom surface, the opening having a width defined by a first sidewall and a second sidewall;
    depositing a first film on the film stack surface, and on the first sidewall, the second sidewall, and the bottom surface of the opening, the first film having a void located within the width of the opening at a first distance from the bottom surface of the opening, and the first film have a first seam with a first seam length;
    etching the first film to form a first recess having a first recess depth;
    depositing a second film in the first recess and on the substrate surface;
    etching the second film to form a second recess having a second recess depth less than the first recess depth; and
    depositing a third film in the second recess and on the substrate surface.

15. The method of claim 14, wherein etching the first film does not open the void.

16. The method of claim 14, wherein first recess depth is greater than the first seam length.

17. The method of claim 14, wherein the first film, the second film, and the third film are independently selected from one or more of silicon nitride (SiN) or silicon oxide ($SiO_x$).

18. A processing method comprising:
    providing a substrate surface with at least one feature thereon, the at least one feature extending a feature depth from the substrate surface to a bottom surface, the at least one feature having a width defined by a first sidewall and a second sidewall
    depositing a first film on the substrate surface, and the first sidewall, the second sidewall, and the bottom surface of the at least one feature, the first film having a void located within the width of the feature at a first distance from the bottom surface of the feature, and the first film having a first seam;
    etching the first film to form a first recess having a first recess depth;
    depositing a second film in the first recess and on the substrate surface;
    etching the second film to form a second recess having a second recess depth less than the first recess depth; and
    depositing a third film in the second recess and on the substrate surface.

19. The processing method of claim 18, wherein the first recess depth is greater than the first seam length.

20. The processing method of claim 18, wherein depositing the second film forms a second seam having a second seam length, and the second recess depth is greater than the second seam length.

* * * * *